US009423462B1

(12) United States Patent
Curtis

(10) Patent No.: US 9,423,462 B1
(45) Date of Patent: Aug. 23, 2016

(54) RELAY TESTING DEVICE AND METHODS FOR TESTING RELAYS

(71) Applicant: Kevin M Curtis, Locust, NC (US)

(72) Inventor: Kevin M Curtis, Locust, NC (US)

( * ) Notice: Subject to any disclaimer, the term of this patent is extended or adjusted under 35 U.S.C. 154(b) by 320 days.

(21) Appl. No.: 13/867,105

(22) Filed: Apr. 21, 2013

Related U.S. Application Data

(60) Provisional application No. 61/688,070, filed on May 7, 2012.

(51) Int. Cl.
  *G01R 31/327* (2006.01)
(52) U.S. Cl.
  CPC .................................. *G01R 31/327* (2013.01)
(58) Field of Classification Search
  CPC .................................................. G01R 31/3278
  See application file for complete search history.

(56) References Cited

U.S. PATENT DOCUMENTS

| 5,256,973 | A  | * | 10/1993 | Thee et al. ..................... 324/418 |
| 2003/0132752 | A1 | * | 7/2003 | Johnson et al. ............... 324/418 |
| 2004/0085071 | A1 | * | 5/2004 | Sankey .......................... 324/418 |
| 2008/0036472 | A1 | * | 2/2008 | Collins et al. ................ 324/649 |
| 2008/0132106 | A1 | * | 6/2008 | Burnes ............... A61B 5/04286 439/352 |

* cited by examiner

*Primary Examiner* — Tung X Nguyen
*Assistant Examiner* — Feba Pothen
(74) *Attorney, Agent, or Firm* — Quickpatents, LLC; Kevin Prince

(57) ABSTRACT

A testing device for a relay includes an enclosure for containing a circuit that includes at least one electrical socket adapted for selective engagement with a connector of the relay, a power source, a testing indicator LED adapted to convey a testing results indication, a power switch, and a testing IC adapted to run a series of tests on the relay when the relay is engaged with the at least one socket. In use, with the connector of the relay engaged with the at least one socket, power may be applied to the circuit such that the testing IC runs the series of tests on the relay by alternately activating and deactivating the coil power lines and measuring the resulting state of the armature line, the normally open signal line, and if available the normally closed signal line of the relay.

17 Claims, 2 Drawing Sheets

RELAY TESTING DEVICE AND METHODS FOR TESTING RELAYS

CROSS-REFERENCE TO RELATED APPLICATIONS

This application claims the benefit of U.S. Provisional Patent Application 61/688,070, filed on May 7, 2012, and incorporated herein by reference.

STATEMENT REGARDING FEDERALLY SPONSORED RESEARCH AND DEVELOPMENT

Not Applicable.

FIELD OF THE INVENTION

This invention relates to electronic testers, and more particularly to a relay testing device.

DISCUSSION OF RELATED ART

Relays are electro-mechanical devices that allow a small power signal to control a relatively larger power load. For example, in an automobile circuit a relay is often used to control a headlamp circuit. The light switch that is operated by the automobile's driver is connected to the input or coil side of the relay. This input side requires a relatively small amount of power from the light switch circuit. When the headlamp switch is switched to the on position, power is applied to the coil causing a magnetic field to be created about the coil's longitudinal axis which in turn attracts the ferrous metal pole piece of the output side of the relay causing the contacts to change state causing the headlamp circuit to close applying power to the relatively high power headlamp circuit. In effect, the relatively small power drawn from the headlamp switch circuit controls the larger power that is delivered through an independent circuit to the headlamp circuit. This type of configuration is used throughout industry and all different types of electrical/electronic controls for equipment, automobiles, implements, automation equipment and just about any device that requires some type of moderate power controls.

When troubleshooting an electronic circuit, such as in an automobile, it is often valuable to first test any relays in the circuit to ensure that they are working properly. In automotive circuits, often there is no convenient access to electrical test points that can be checked while the circuit is in operation or "live". Relays comprise a control (coil) connector and a load side. The coil when energized by a control circuit causes the relay to operate at least one mechanical contact causing a connected load circuit to be energized or de-energized by the operation of the mechanical contact. When a circuit of this type fails it becomes necessary to check the voltages and currents at different locations within the relay to determine the cause of the problem. If there happens to be test points in the circuit that can be easily accessed, then a Voltmeter and Ammeter (Digital Multimeter or just DMM) may be used to display the electrical measurements of the circuit. The disadvantage of using a DMM is that it is time consuming and particularly difficult to take the current readings in the live circuit. A DMM is also incapable of making automatic measurements of a relay in order to determine whether or not it is functioning properly.

Therefore, there is a need for a device can be programmed to automatically apply signals to the relay and evaluate the actions of the output circuit to determine if the relay is properly working or not. Such a needed device would include a plurality of sockets each for accepting one of a plurality of different types or "form factors" of relays. Further, such a needed invention would allow the user to quickly remove a relay from its original circuit, insert the relay into the proper socket of the invention, and quickly run the relay through a series of tests to determine if the relay is properly working or not. The present invention accomplishes these objectives.

SUMMARY OF THE INVENTION

The present device is a testing device for a relay of the type having an electrical connector that includes at least a pair of coil power lines, an armature signal line, a normally open signal line, and optionally a normally closed signal line. The testing device includes an enclosure for containing therein a circuit that includes at least one electrical socket adapted for selective engagement with the connector of the relay. The at least one socket is fixed at least partially through the enclosure. The circuit includes a power source, a testing indicator adapted to convey a testing results indication to outside of the enclosure, and a testing IC adapted to run a series of tests on the relay when the relay is engaged with the at least one socket. The circuit may further include a power switch that activates the circuit by connecting power from the power source thereto.

The testing indicator may be at least one LED for indicating the testing results by color, for example, or by the number of LEDs illuminated. The device may further include a relay type indicator switch for indicating that the relay either has or does not have the normally closed signal line. When the relay being tested does have the normally closed signal line, the testing IC may perform additional tests and measurements of the normally closed signal line to determine whether the relay is functioning correctly.

In one embodiment the power source is at least one battery contained within the enclosure. In another embodiment, the power source is an external power source, such as a wall outlet and an AC adapter, supplied to the circuit through a power line traversing the enclosure.

Preferable the at least one electrical socket is a plurality of the electrical sockets, each of which is a unique type adapted for selective engagement with one of a number of different types of relays, each socket mutually connected in parallel with each other in the circuit.

In use, with the connector of the relay engaged with the at least one socket, power may be applied to the circuit such that the testing IC runs the series of tests on the relay by alternately activating and deactivating the coil power lines and measuring the resulting state of the armature line, the normally open signal line, and if available the normally closed signal line of the relay.

If all tests indicate a properly working relay then the testing indicator conveys a positive testing results indication, such as illuminating a green LED. Alternately, if any of the tests indicate an improperly working relay, then the testing indicator conveys a negative testing result indication, such as illuminating a red LED.

The present invention is a device programmed to automatically apply signals to a relay and evaluate signals on the load side of the relay to determine if the relay is properly working or not. Such a needed device would include a plurality of sockets each for accepting one of a plurality of different types or "form factors" of relays. Further, such a needed invention would allow the user to quickly remove a relay from its original circuit, insert the relay into the proper socket of the invention, and quickly run the relay through a series of tests to determine if the relay is properly working or not. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list. When the word "each" is used to refer to an element that was previously introduced as being at least one in number, the word "each" does not necessarily imply a plurality of the elements, but can also mean a singular element.

Figure 1:
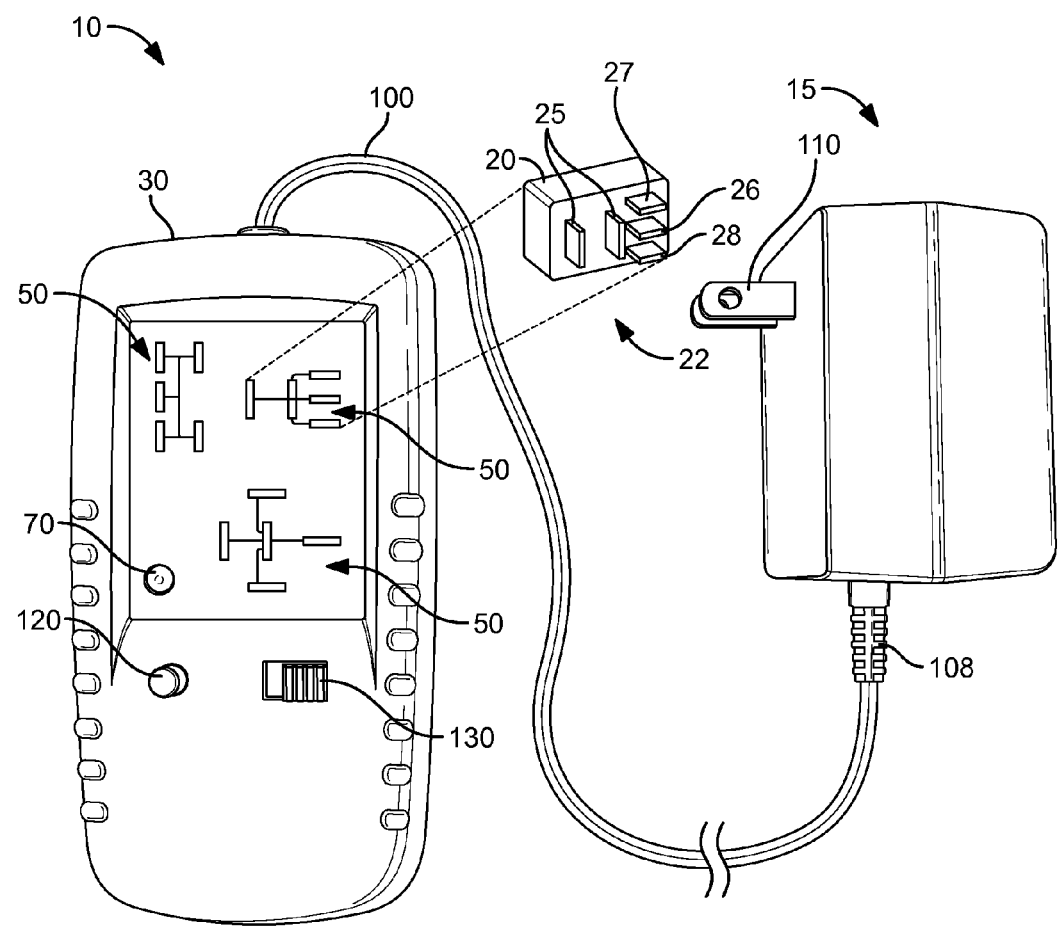
FIG. 1 is a perspective view of the invention.
Figure 2:
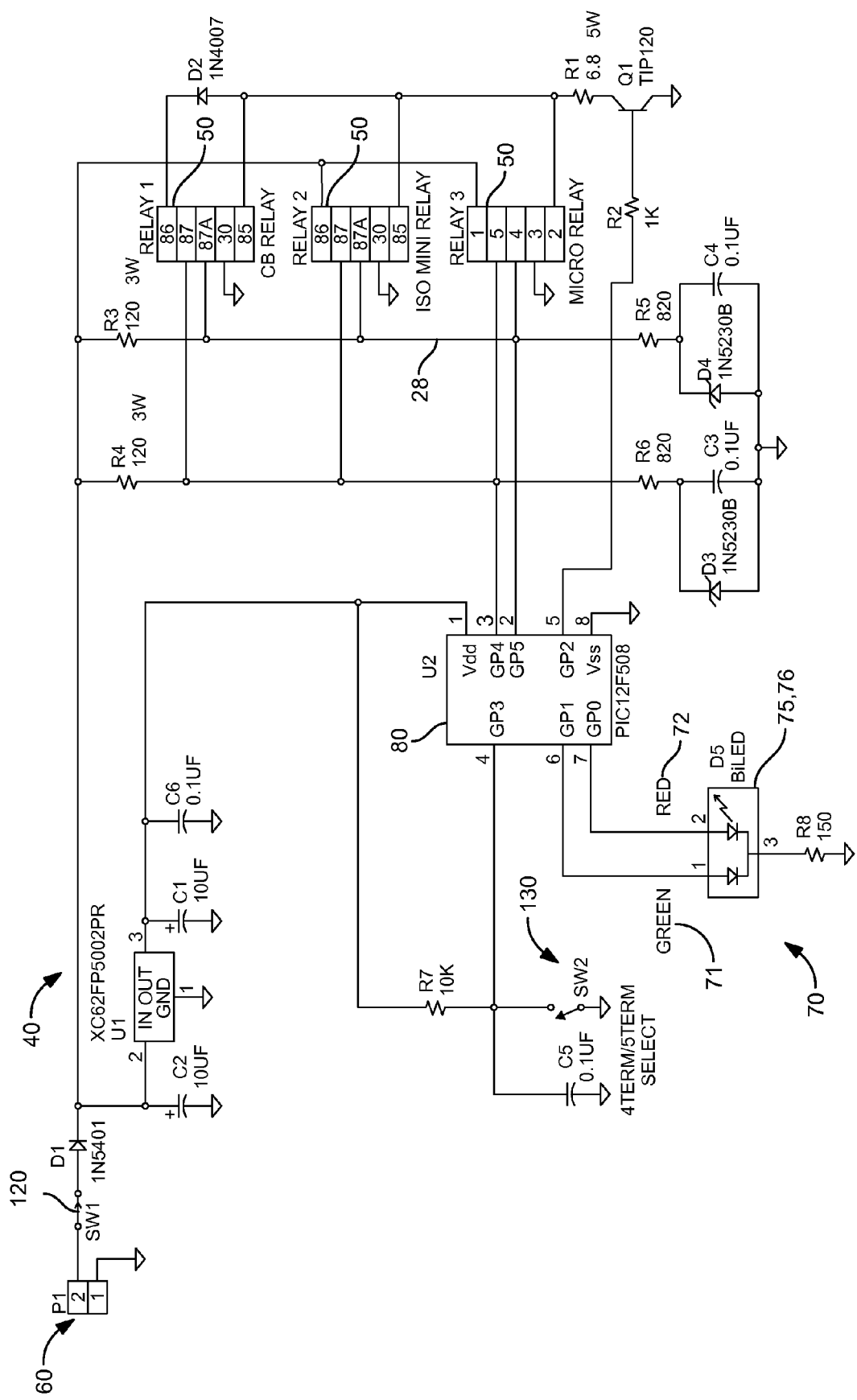
FIG. 2 is a schematic diagram of one embodiment of the invention.

FIGS. 1 and 2 illustrate a testing device 10 for a relay 20 of the type having an electrical connector 22 that includes at least a pair of coil power lines 25, an armature signal line 26, and a normally open signal line 27. Such relays typically have an enclosure surrounding the components of the relay and have the electrical connector 22 exposed along one side thereof. Different types and ratings of relays 20 having different pin configurations for the electrical connector 22.

The testing device includes an enclosure 30 for containing therein a circuit 40 that includes at least one electrical socket 50 adapted for selective engagement with the connector 22 of the relay 20. The at least one socket 50 is fixed at least partially through the enclosure, a power source 60, a testing indicator 70 adapted to convey a testing results indication to outside of the enclosure, and a testing IC 80 adapted to run a series of tests on the relay 20 when the relay 20 is engaged with the at least one socket 50. The circuit 40 may further include a power switch 120 that activates the circuit 40 by connecting power from the power source 60 thereto.

The testing indicator 70 may be at least one LED 75 for indicating the testing results by color, for example, or by the number of LEDs illuminated. In one embodiment the testing indicator 70 is a tri-color LED 76, wherein the color red indicates at least one failed test and an improperly working relay 20, and the color green indicates all tests passed and a properly working relay 20. In such an embodiment, the third color of the tri-color LED 76, such as yellow, may indicate that testing of the relay 20 has not yet been completed.

The relay 20 may be of the type that further includes a normally closed signal line 28. As such, the device 10 may further include a relay type indicator switch 130 for indicating that the relay 20 either has or does not have the normally closed signal line 28. When the relay 20 being tested does have the normally closed signal line 28, the testing IC 80 may perform additional tests and measurements of the normally closed signal line 28 to determine whether the relay 20 is functioning correctly.

In one embodiment the power source 60 is at least one battery 90 contained within the enclosure 30. In another embodiment, the power source 60 is an external power source 15, such as a wall outlet and an AC adapter, supplied to the circuit through a power line 100 traversing the enclosure 30. In such an embodiment a distal end 108 of the power line 100 terminates in at least one power connector 110 for attaching to the external power source 15.

Preferable the at least one electrical socket 50 is a plurality of the electrical sockets 50, each of which is a unique type adapted for selective engagement with one of a number of different types of relays 20, each socket 50 mutually connected in parallel with each other in the circuit 40.

In use, with the connector 22 of the relay 20 engaged with the at least one socket 50, power may be applied to the circuit 40 such that the testing IC 80 runs the series of tests on the relay by alternately activating and deactivating the coil power lines 25 and measuring the resulting state of the armature line 26, the normally open signal line 27, and if available the normally closed signal line 28 of the relay.

Such tests may include, for example, ensuring that upon activation of the pair of coil power lines 25 that the armature signal line 26 within a predetermined allowable period of time becomes electrically connected to the normally open signal line 27 and remains connected until power is removed from the coil power lines 25. Further, such a test can determine if the relay 20 exhibits an acceptable amount of so-called "contact bounce," wherein the normally open signal line 27 connects, and then briefly disconnects, and then reconnects to the armature signal line 26 when the coil power lines 25 are first activated. Likewise, in the case wherein the relay 20 includes the normally closed signal line 28, the tests may include ensuring that upon activation of the pair of coil power lines 25 that the armature signal line 26 within a predetermined allowable period of time becomes electrically disconnected from the normally closed signal line 28. Further, such a test can determine if the relay 20 exhibits an acceptable amount of so-called contact bounce, wherein the normally closed signal line 28 connects, and then briefly disconnects, and then reconnects to the armature signal line 26 when the coil power lines 25 are first deactivated.

If all tests indicate a properly working relay 20 then the testing indicator 70 conveys a positive testing results indication 71, such as illuminating a green LED. Alternately, if any of the tests indicate an improperly working relay 20, then the testing indicator 70 conveys a negative testing result indication 72, such as illuminating a red LED. Alternately, the testing indicator 70 may be a sound transducer whereby the pass or fail status of the test of the relay 20 is indicated audibly.

While a particular form of the invention has been illustrated and described, it will be apparent that various modifications can be made without departing from the spirit and scope of the invention. For example, three different types of configurations of relays are illustrated in the three sockets 50 of FIG. 1. However, any other practical number of sockets 50 could be utilized for testing any number of different relays. Accordingly, it is not intended that the invention be limited, except as by the appended claims.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

While certain aspects of the invention are presented below in certain claim forms, the inventor contemplates the various aspects of the invention in any number of claim forms. Accordingly, the inventor reserves the right to add additional claims after filing the application to pursue such additional claim forms for other aspects of the invention.

What is claimed is:

1. A testing device for a relay of the type having an electrical connector that includes at least a pair of coil power lines, an armature signal line, and a normally open signal line, the testing device comprising:
    an enclosure;
    a circuit contained substantially within the enclosure and including a plurality of electrical sockets adapted for selective engagement with the connector of the relay, the plurality of electrical sockets disposed within the enclosure such that the electrical connector of the relay is configured to extend through the enclosure into one of the plurality of electrical sockets, a power source, a testing indicator adapted to convey a testing results indication to outside of the enclosure, and a testing IC adapted to run a series of tests on the relay when the relay is engaged with one of the plurality of electrical sockets; and
    a relay type indicator switch for indicating the relay either having or not having a normally closed signal line, the relay type indicator switch being a user-operable mechanical switch, wherein when the relay being tested does have the normally closed signal line, the testing IC performs additional tests and measurements of the normally closed signal line to determine whether the relay is functioning correctly;
    whereby with the electrical connector of the relay engaged with one of the plurality of electrical sockets, power is applied to the circuit such that the testing IC runs the series of tests on the relay by alternately activating and deactivating the coil power lines and measuring the resulting state of the armature line and normally open signal line of the relay, whereupon if all tests indicate a properly working relay then the testing indicator conveys a positive testing results indication, or alternately if any of the tests indicate an improperly working relay then the testing indicator conveys a negative testing result indication;
    wherein each socket of the plurality of electrical sockets mutually connected in parallel with each other to the circuit.

2. The testing device of claim 1 wherein each of the plurality of electrical sockets being a unique type adapted for selective engagement with one of a number of different types of relays.

3. The testing device of claim 1 wherein the power source is a battery contained within the enclosure.

4. The testing device of claim 1 wherein the power source is an external power source supplied to the circuit through a power line traversing the enclosure.

5. The testing device of claim 4 wherein the power line includes a distal end terminating in at least one power connector for attaching to the external power source.

6. The testing device of claim 1 wherein the testing indicator is an LED for indicating the testing results by color or the power state of the LED.

7. The testing device of claim 6 wherein the LED is a tri-color LED, wherein the color red indicates at least one failed test and an improperly working relay, and the color green indicates all tests passed and a properly working relay.

8. The testing device of claim 7 wherein the color yellow indicates that testing of the relay has not yet been completed.

9. The testing device of claim 1 further including a power switch that activates the circuit by connecting power from the power source thereto.

10. The testing device of claim 9 wherein the relay includes a normally closed signal line.

11. A method of testing a relay of the type having an electrical connector that includes at least a pair of coil power lines, an armature signal line, and a normally open signal line, the method comprising the steps:
    providing an enclosure and a circuit contained substantially within the enclosure, the circuit including a plurality of electrical sockets connected in parallel, one of the plurality of electrical sockets adapted for selective engagement with the connector of the relay, the plurality of electrical sockets disposed within the enclosure such that the electrical connector of the relay is configured to extend through the enclosure into one of the plurality of electrical sockets, a power source, a testing indicator adapted to convey a testing results indication to outside of the enclosure, and a testing IC adapted to run a series of tests on the relay when the relay is engaged with the socket and when power from the power source is applied to the circuit;

connecting the connector of the relay to the at least one electrical socket of the device;

switching a relay type indicator switch for indicating the relay either having or not having a normally closed signal line, the relay type indicator switch being a user-operable mechanical switch;

applying power to the circuit from the power source;

the testing IC alternately activating and deactivating the coil power lines and measuring the resulting state of the armature line and normally open signal line of the relay to determine if the state of the armature line and the normally open signal line of the relay are working properly, and, when the relay being tested does have the normally closed signal line, the testing IC performs additional tests and measurements of the normally closed signal line to determine whether the relay is functioning correctly; and the circuit causing the testing indicator to convey a positive testing results indication if all tests indicate a properly working relay, or alternately causing the testing indicator to convey a negative testing results indication.

12. A testing device for a relay of the type having an electrical connector that includes at least a pair of coil power lines, an armature signal line, and a normally open signal line, the testing device comprising:

an enclosure;

a circuit contained substantially within the enclosure;

a plurality of electrical sockets, electrically connected in parallel to the circuit and adapted for selective engagement with the connector of the relay, the plurality of electrical sockets disposed within the enclosure such that the electrical connector of the relay is configured to extend through the enclosure into one of the plurality of electrical sockets;

a battery contained within the enclosure, the battery providing a power source for the testing device;

a testing indicator adapted to convey a testing results indication to outside of the enclosure;

a testing IC adapted to run a series of tests on the relay when the relay is engaged with one of the plurality of electrical sockets; and a relay type indicator switch for indicating the relay either having or not having a normally closed signal line, the relay type indicator switch being a user-operable mechanical switch, wherein when the relay being tested does have the normally closed signal line, the testing IC performs additional tests and measurements of the normally closed signal line to determine whether the relay is functioning correctly;

whereby with the electrical connector of the relay engaged with one of the plurality of electrical sockets, power is applied to the circuit such that the testing IC runs the series of tests on the relay by alternately activating and deactivating the coil power lines and measuring the resulting state of the armature line and normally open signal line of the relay, whereupon if all tests indicate a properly working relay then the testing indicator conveys a positive testing results indication, or alternately if any of the tests indicate an improperly working relay then the testing indicator conveys a negative testing result indication.

13. The testing device of claim 12 wherein each of the plurality of electrical sockets being a unique type adapted for selective engagement with one of a number of different types of relays, each socket of the plurality of electrical sockets mutually connected in parallel with each other to the circuit.

14. The testing device of claim 12 wherein the testing indicator is an LED for indicating the testing results by color or the power state of the LED.

15. The testing device of claim 14 wherein the LED is a tri-color LED, wherein the color red indicates at least one failed test and an improperly working relay, and the color green indicates all tests passed and a properly working relay.

16. The testing device of claim 15 wherein the color yellow indicates that testing of the relay has not yet been completed.

17. The testing device of claim 12 further including a power switch that activates the circuit by connecting power from the power source thereto.

* * * * *